United States Patent
Dalena et al.

(10) Patent No.: US 10,601,323 B2
(45) Date of Patent: Mar. 24, 2020

(54) PEAK CURRENT DETECTION FOR COMPENSATING ERRORS IN A POWER CONVERTER

(71) Applicant: Dialog Semiconductor (UK) Limited, London (GB)

(72) Inventors: Francesco Dalena, Leghorn (IT); Alexandre Morello, Leghorn (IT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/843,354

(22) Filed: Dec. 15, 2017

(65) Prior Publication Data

US 2019/0190387 A1    Jun. 20, 2019

(51) Int. Cl.
H02M 3/158    (2006.01)
H02M 1/08    (2006.01)
H03K 5/1532    (2006.01)
H02M 1/00    (2006.01)

(52) U.S. Cl.
CPC ........... *H02M 3/1588* (2013.01); *H02M 1/08* (2013.01); *H03K 5/1532* (2013.01); *H02M 2001/0009* (2013.01)

(58) Field of Classification Search
CPC .................................................. H02M 3/158
See application file for complete search history.

(56) References Cited

U.S. PATENT DOCUMENTS

| 6,762,627 | B1 | 7/2004 | Gater | |
| 2002/0044004 | A1* | 4/2002 | Guido, Jr. | H02M 1/08 327/465 |
| 2009/0160418 | A1* | 6/2009 | Kawagishi | H02M 3/156 323/311 |
| 2009/0284171 | A1* | 11/2009 | Bayadroun | H05B 33/0803 315/294 |
| 2012/0049810 | A1 | 3/2012 | Huang et al. | |
| 2013/0038236 | A1* | 2/2013 | Mitarashi | H02M 3/156 315/240 |

(Continued)

FOREIGN PATENT DOCUMENTS

CN    103248228    8/2013

*Primary Examiner* — Jue Zhang
*Assistant Examiner* — Trinh Q Dang
(74) *Attorney, Agent, or Firm* — Saile Ackerman LLC; Stephen B. Ackerman

(57) ABSTRACT

A power converter which converts electrical power at an input voltage into electrical power at an output voltage is presented. It has a power stage with a high side switching element, a low side switching element and an inductor. The power converter has a voltage-to-current converter coupled to the power stage to convert a voltage indicative of a current flowing into the inductor into an indicator current. A peak current detector receives the indicator current to determine a pedestal component of the indicator current in a first time interval during which the high side switching element is open, and to generate a calibrated indicator current by subtracting the pedestal component from the indicator current. The peak current detector compares the calibrated indicator current with a threshold value for detecting a more precise peak current flowing into the inductor, taking into account the effects of temperature or circuit aging.

14 Claims, 4 Drawing Sheets

(56) References Cited

U.S. PATENT DOCUMENTS

| | | | |
|---|---|---|---|
| 2013/0049715 A1* | 2/2013 | Groom | H02M 3/156 |
| | | | 323/271 |
| 2013/0200869 A1 | 8/2013 | Sasao et al. | |
| 2013/0314062 A1 | 11/2013 | Notman et al. | |
| 2013/0314067 A1 | 11/2013 | Matzberger et al. | |
| 2014/0191737 A1* | 7/2014 | Nagasawa | H02M 3/1584 |
| | | | 323/272 |
| 2015/0061786 A1 | 3/2015 | Mai | |
| 2016/0373002 A1* | 12/2016 | Borfigat | H02M 1/32 |

\* cited by examiner

PEAK CURRENT DETECTION FOR COMPENSATING ERRORS IN A POWER CONVERTER

TECHNICAL FIELD

The present document relates to peak current detection in a power converter. In particular, the present document relates to improved peak current detection in DC/DC power converters in which a voltage indicative of a coil current is translated into a corresponding indicator current before a voltage corresponding to said indicator current is finally compared against a threshold voltage in order to detect a peak of the coil current.

BACKGROUND

DC/DC power converters may be used for converting electrical power at an input voltage to electrical power at an output voltage, wherein the input voltage and the output voltage are different. The input voltage may e.g. be in the range of 15V which is typically referred to as a high voltage HV application.

In DC/DC power converters, it is mandatory to control the maximum peak current that flows into the coil/inductor in order to prevent magnetic saturation. In HV DC/DC converters, one possible way to implement e.g. a positive peak current detection is shown in FIG. 1. FIG. 1 illustrates a power stage 1, a voltage-to-current converter 2, and a peak current detector 3. In the power stage 1, a voltage indicative of an inductor current is generated at node 10 with the help of replica device 18. Subsequently, the voltage generated at node 10 is converted into an indicator current $I_{sns}$ at the output of the voltage-to-current converter 2, wherein the indicator current $I_{sns}$ may be proportional to the coil current in the power stage 1. In the end, the indicator current $I_{sns}$ flows into resistor 32 of the peak current detector 3 for a final voltage conversion and is then compared with a threshold value that represents a peak current value. Those skilled in the art will appreciate that the described voltage/current/voltage conversion becomes necessary in HV DC/DC power converters since switching at node 16 of power stage 1 occurs in the high voltage domain and it is thus not trivial to read information on the coil current directly from node 16 of the power stage 1.

One problem of the implementation shown in FIG. 1 is the significant spread of the indicator current $I_{sns}$ and the resulting inaccuracy of the peak current detection. In practice, the spread of the indicator current $I_{sns}$ may be caused e.g. by the different current mirrors used in the voltage-to-current converter 2 or by the spread introduced by the replica device 18 itself. Moreover, the spread of the indicator current $I_{sns}$ shows a strong dependency on temperature changes (see also FIG. 2). One solution to improve the accuracy of the peak current detection is to provide a suitable trimming circuit that statically compensates the offsets introduced by the different circuit components of the voltage-to-current converter 2 and the power stage 1. However, such a static solution fails to solve the problem at different temperatures. Specifically, a static solution may not be sufficient e.g. for DC/DC converters operated in pulse frequency modulation PFM mode where very precise peak current detection circuits are required.

SUMMARY

The present document addresses the above mentioned technical problems. In particular, the present document addresses the technical problem of providing a system and method for an improved, more precise peak current detection which takes into account the effects of temperature changes or aging of the circuit. According to an aspect, a power converter is configured to convert electrical power at an input voltage at an input terminal into electrical power at an output voltage at an output terminal. The power converter comprises a power stage with a high side switching element connected between the input terminal and a switching terminal, and a low side switching element connected between the switching terminal and a reference terminal. Optionally, the power stage of the power converter may also comprise an inductor connected between the switching terminal and the output terminal. A voltage-to-current converter is coupled to the power stage and configured to convert a voltage indicative of a current flowing into the inductor into an indicator current. A peak current detector is configured to receive said indicator current at an input node, to determine a pedestal component of the indicator current in a first time interval during which the high side switching element is open, and to generate a calibrated indicator current by subtracting the pedestal component from the indicator current.

The power converter may be a DC/DC power converter such as e.g. a buck converter. For example, the power converter may be operated in a pulse frequency modulation PFM mode or in a pulse width modulation PWM mode. Each of the two switching elements in the power stage may be implemented with any suitable device, such as, for example, a metal-oxide-semiconductor field effect transistor MOSFET, an insulated-gate bipolar transistor IGBT, a MOS-gated thyristor, or other suitable power device. Each switching element has a gate to which a respective driving voltage or control signal may be applied to turn the switching element on or off.

The indicator current may be indicative of the current flowing into the inductor. More specifically, the indicator current may be a proportional, scaled down version of the current flowing through the high side switching element to the inductor in times when the high side switching element is closed. However, the indicator current may comprise a second component—denoted as pedestal component—which is added to a first component which actually indicates the current flowing into the inductor. This pedestal component is contributed by the electrical components of the power stage and the voltage-to-current converter, and may vary depending on the temperature. The pedestal component of the indicator current may be necessary e.g. to prevent turning off the voltage-to-current converter and to guarantee a fast response time of the voltage-to-current converter. In case the current into the inductor and therefore the output current of the entire power converter is low, the pedestal component of the indicator current constitutes a non-neglectable, dominating part of the indicator current. By subtracting this pedestal component (or more precisely: an estimate of this pedestal component) from the indicator current, it becomes possible to minimize temperature dependent errors in the indicator current in a dynamic manner. As a consequence, a temperature-dependent spread of the indicator current is reduced and the precision of the peak current detection is substantially increased. Additional trimming circuits become dispensable, resulting in a reduction of the test time of the power converter.

In the following description, a peak current detector is presented which may be configured to read/sample the indicator current only during a first time interval during which the high side switching element is open. During this first time interval, which will be also denoted as sample phase, there may be no current flowing into the coil and the low side switching element may be turned on. Further, the peak current detector may be configured to generate the calibrated indicator current by subtracting the pedestal component from the indicator current in a second time interval during which the high side switching element is closed. To be more specific, the peak current detector may generate the calibrated indicator current only during said second time interval, which will also be denoted as hold phase in the below description. In other words, by alternately (a) determining the pedestal component in the sample phase and (b) generating the calibrated indicator current in the hold phase, the peak current detector performs an automatic calibration routine for counteracting the spread of the indicator current caused by temperature changes. Ultimately, the peak current detector may then be configured to compare said calibrated indicator current with a threshold current value for detecting a peak of the current flowing into the inductor.

The reference terminal may be e.g. ground. Throughout this document, the term "ground" is meant in its broadest possible sense. In particular, ground is not limited to a reference point with a direct physical connection to earth. Rather, the term "ground" may refer to any reference point to which and from which electrical currents may flow or from which voltages may be measured.

The peak current detector may comprise a capacitor for storing a pedestal voltage indicative of said pedestal component of the indicator current during said first time interval. Put in a different way, the capacitor may be charged according to the indicator current provided by the voltage-to-current converter during the sample phase. To this end, the peak current detector further may comprise a transistor whose gate is coupled to a terminal of the capacitor such that the pedestal component of the indicator current flowing through said transistor during said first time interval causes said capacitor to be charged to said pedestal voltage. For example, the drain of said transistor may be connected to said input node of the peak current detector, the source of said transistor may be connected to the reference terminal, and a second terminal of the capacitor may be connected to the reference terminal. In this configuration, a gate-source voltage caused by the pedestal component of the indicator current flowing through the source and drain of the transistor charges the capacitor to the pedestal voltage.

The peak current detector may further comprise a comparator and a first switch configured to connect, during the hold phase during which the high side switching element is closed, the input node of the peak current detector with an input of the comparator such that the calibrated indicator current is branched off from the indicator current. The other way round, during the sample phase, the first switch may be open for disconnecting the input node of the peak current detector from the input of the comparator such that the indicator current (which is formed mainly by the pedestal component during the sample phase) may flow in the described transistor and thereby enables/controls the charging of the capacitor to the pedestal voltage.

That is, by connecting the input node of the peak current detector with the input of the comparator, the first switch enables splitting the indicator current into the calibrated indicator current and the pedestal component of the indicator current. At this, during the hold phase, the pedestal voltage stored at the capacitor may drive the gate-source voltage of the transistor such that a current corresponding to the pedestal component of the indicator current is enforced and subtracted from the indicator current. The remaining calibrated indicator current then serves as an improved estimate of the current flowing into the inductor.

The comparator may be configured to compare said calibrated indicator current with said threshold current value for detecting a peak of the current flowing into the inductor. For this purpose, the peak current detector may further comprise a resistor coupled between the input of said comparator and the reference terminal. In this configuration, the resistor may translate the calibrated indicator current into a corresponding voltage at the input of the comparator. The comparator may then be configured to compare said corresponding voltage with a threshold voltage value associated with said threshold current value. The comparator may be configured to compare the two analog voltages at its inputs and may generate a binary output signal indicating which of the two analog voltages has a greater voltage value.

Moreover, the peak current detector may comprise an error amplifier configured to compare a voltage at the input node with a reference voltage, and a second switch configured to connect, during the sample phase, an output of the error amplifier with a terminal of the capacitor. The error amplifier may be configured to generate an output signal at its output, the output signal indicating an amplified difference voltage between the voltage at the input node and the reference voltage. In particular, the terminal of the capacitor may be the same terminal to which also the gate of the transistor is connected. As a result, an output current generated by the error amplifier may charge the capacitor to the pedestal voltage during the sample phase, wherein the charging process is ultimately controlled by the gate-source voltage across the transistor. The other way round, the second switch may be configured to disconnect, during the hold phase, the output of the error amplifier from said terminal of the capacitor. The reference voltage may be chosen equal the threshold voltage value of the comparator.

The power stage may further comprise a replica transistor coupled to the switching terminal, wherein a gate of the replica transistor is coupled to a gate of the high side switching element, and wherein the voltage indicative of the current flowing into the inductor is provided at a terminal of the replica transistor. The latter terminal of the replica transistor may be e.g. the drain of the replica transistor. Moreover, the voltage-to-current converter may comprise at least one current mirror.

According to another aspect, a method of converting electrical power at an input voltage at an input terminal of a power converter into electrical power at an output voltage at an output terminal of the power converter is described. The method comprises connecting, within a power stage of the power converter, a high side switching element between the input terminal and a switching terminal, and connecting a low side switching element between the switching terminal and a reference terminal. Optionally, the method may also comprise connecting an inductor between the switching terminal and the output terminal. The method further comprises the step of converting, using a voltage-to-current converter coupled to the power stage, a voltage indicative of a current flowing into the inductor into an indicator current. Said indicator current is received at an input node of a peak current detector, a pedestal component of the indicator current is determined in a first time interval during which the high side switching element is open, and a calibrated indicator current is generated by subtracting the pedestal component from the indicator current.

The method may further comprise comparing, by the peak current detector, said calibrated indicator current with a threshold current value for detecting a peak of the current flowing into the inductor. The calibrated indicator current may be generated, by the peak current detector, by subtracting the pedestal component from the indicator current in a second time interval during which the high side switching element is closed.

A capacitor may be provided within the peak current detector for storing a pedestal voltage indicative of said pedestal component of the indicator current during said first time interval. The method may comprise providing a transistor within the peak current detector, and coupling a gate of said transistor to a terminal of the capacitor such that the pedestal component of the indicator current flowing through said transistor during said first time interval causes said capacitor to be charged to said pedestal voltage. Additionally, a comparator and a first switch may be provided within the peak current detector, and, using said first switch, during a second time interval during which the high side switching element is closed, the input node of the peak current detector may be connected with an input of the comparator such that the calibrated indicator current is branched off from the indicator current. The method may further comprise providing a resistor between the input of said comparator and the reference terminal.

The method may further comprise the steps of arranging an error amplifier and a second switch within the peak current detector, comparing, using the error amplifier, a voltage at the input node with a reference voltage, and connecting, using the second switch, during the first time interval, an output of the error amplifier with a terminal of the capacitor. The method may comprise coupling a replica transistor to the switching terminal of the power stage and coupling a gate of the replica transistor to a gate of the high side switching element such that the voltage indicative of the current flowing into the inductor is provided at a terminal of the replica transistor.

It should be noted that the methods and systems including its preferred embodiments as outlined in the present document may be used stand-alone or in combination with the other methods and systems disclosed in this document. In addition, the features outlined in the context of a system are also applicable to a corresponding method.

Furthermore, all aspects of the methods and systems outlined in the present document may be arbitrarily combined. In particular, the features of the claims may be combined with one another in an arbitrary manner.

In the present document, the term "couple", "connect", "coupled" or "connected" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
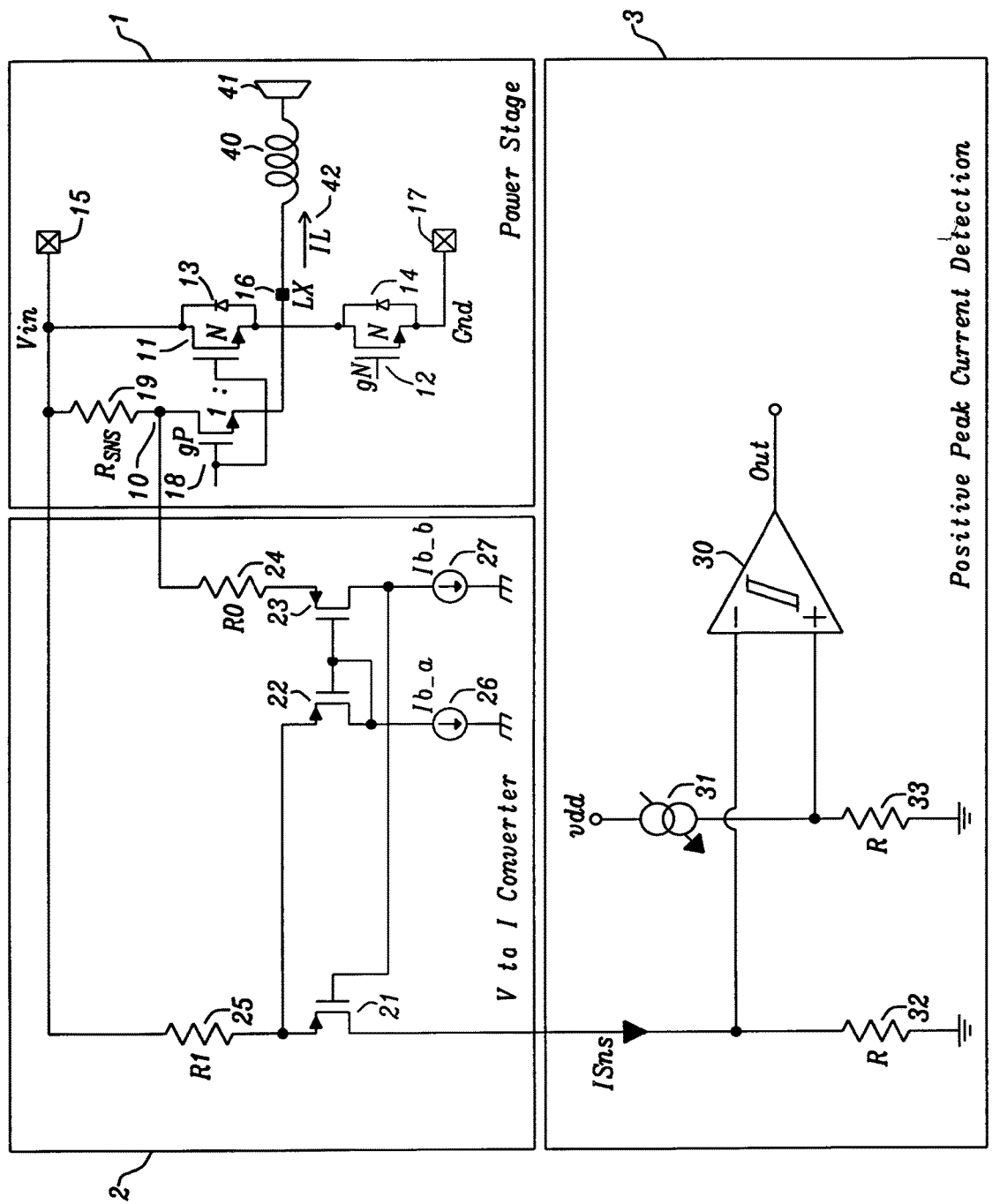
FIG. 1 shows a power converter comprising a power stage, a voltage-to-current converter, and a peak current detector.

As outlined above, the present document relates to peak current detection in a power converter comprising at least a power stage and a voltage-to-current converter. FIG. 1 illustrates an exemplary power converter which is known from the prior art and which exhibits the above-described disadvantages. In particular, the DC/DC converter depicted in FIG. 1 converts electrical power at an input voltage at an input terminal 15 into electrical power at an output voltage at an output terminal 41. The exemplary power converter comprises a power stage 1 with a high side switching element 11 connected between the input terminal 15 and a switching terminal 16, a low side switching element 12 connected between the switching terminal 16 and a reference terminal 17, and an inductor 40 connected between the switching terminal 16 and the output terminal 41. A current IL 42 flows into the inductor 40. FIG. 1 also depicts the body diodes 13 and 14 of the switching elements 11 and 12, respectively. In the depicted circuit, the high side switching element 13 is embodied as an NMOS transistor.

In the power stage 1, a voltage indicative of a current flowing into the inductor is generated at node 10 between the transistor $R_{SNS}$ 19 and replica transistor 18. On the one hand, the gate of replica transistor 18 is connected to the gate of the high side switching element 11, the source of replica transistor 18 is connected to the switching terminal 16, and the drain of replica transistor 18 is connected to node 10. On the other hand, the transistor $R_{SNS}$ 19 connects the input terminal 15 with node 10. The exemplary voltage-to-current converter 2, comprises transistors 21, 22, and 23, resistors 24 and 25, and current sources 26 and 27. The voltage-to-current converter 2 is coupled to node 10 of the power stage 1 via the resistor 24 and converts the voltage indicative of the current flowing into the inductor into an indicator current $I_{sns}$.

A traditional peak current detector 3 receives said indicator current $I_{sns}$ and translates the indicator current $I_{sns}$ with the help of resistor 32 into a corresponding voltage, which is applied to a first input of comparator unit 30. At the second input of comparator unit 30, a reference voltage is applied, wherein said reference voltage is generated by a reference current of current source 31 traversing resistor 33.

Figure 2:
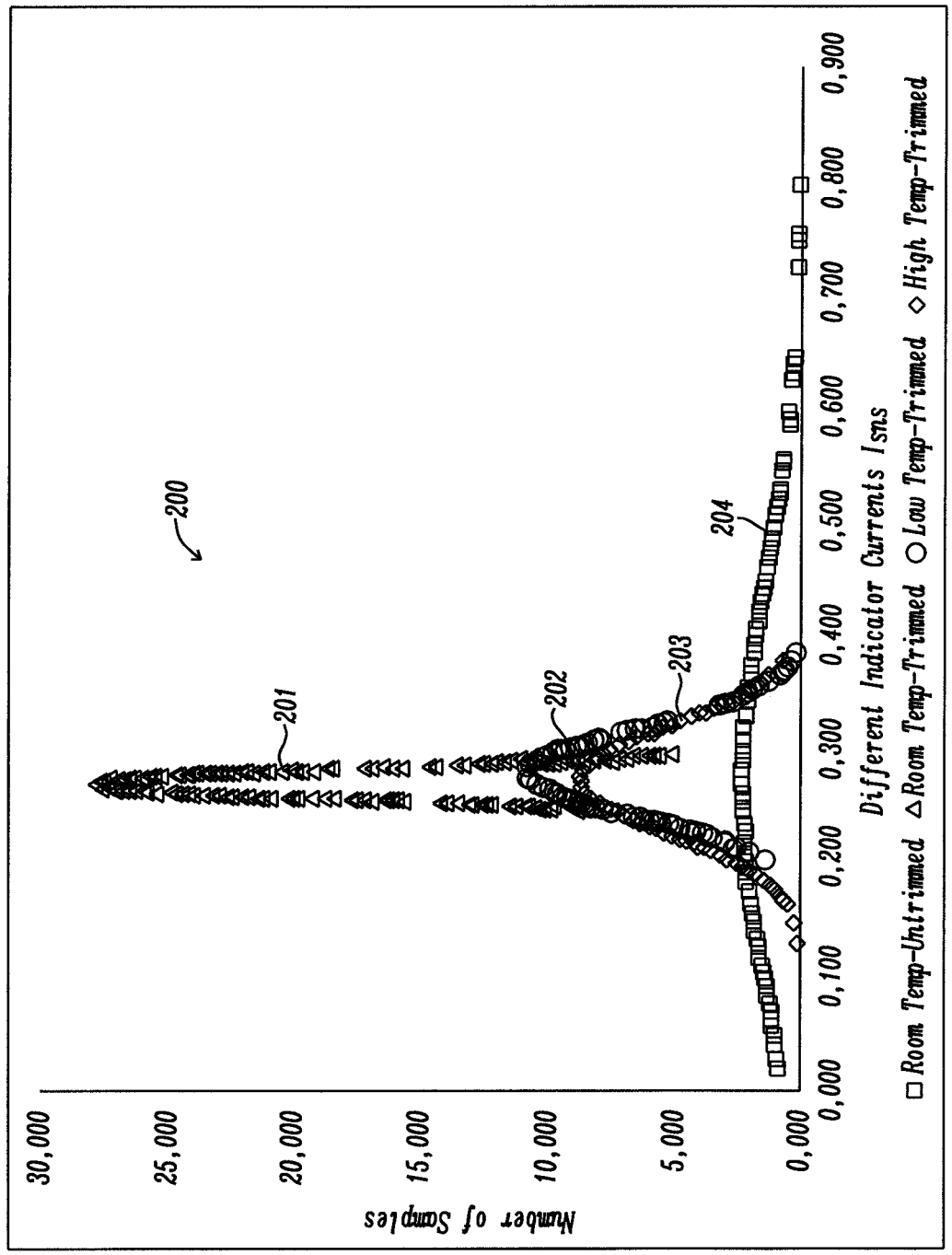
FIG. 2 shows a simulation results for the power converter depicted in FIG. 1.

FIG. 2 shows simulation results for the power converter depicted in FIG. 1. A Monte Carlo simulation has been performed and the diagram 200 shows different indicator currents $I_{sns}$ on the x-axis and the number of samples on the y-axis. Curve 204 indicated by small rectangles is related to the untrimmed circuit at room temperature, i.e. pre-trimmed values, whereas curve 201 indicated by small triangles is related to the circuit after trimming has been performed to compensate the errors introduced e.g. by the current-to-voltage converter 2 and the replica transistor 18. As can be seen in FIG. 2, the trimming substantially reduces the variance of the indicator currents $I_{sns}$ at room temperature. However, the benefits of trimming are lost as soon as the ambient temperature begins to change. This is visualized by simulations performed at a high temperature (curve 203) and at a low temperature (curve 202). In FIG. 2, curve 203 indicated by small rhomboids relates to post-trimmed values at a high temperature, and curve 202 indicated by small crosses relates to post-trimmed values at a low temperature.

Both curves 202 and 203 show a significant spread although a trimming procedure has been performed e.g. in a pre-operational calibration phase.

Figure 3:
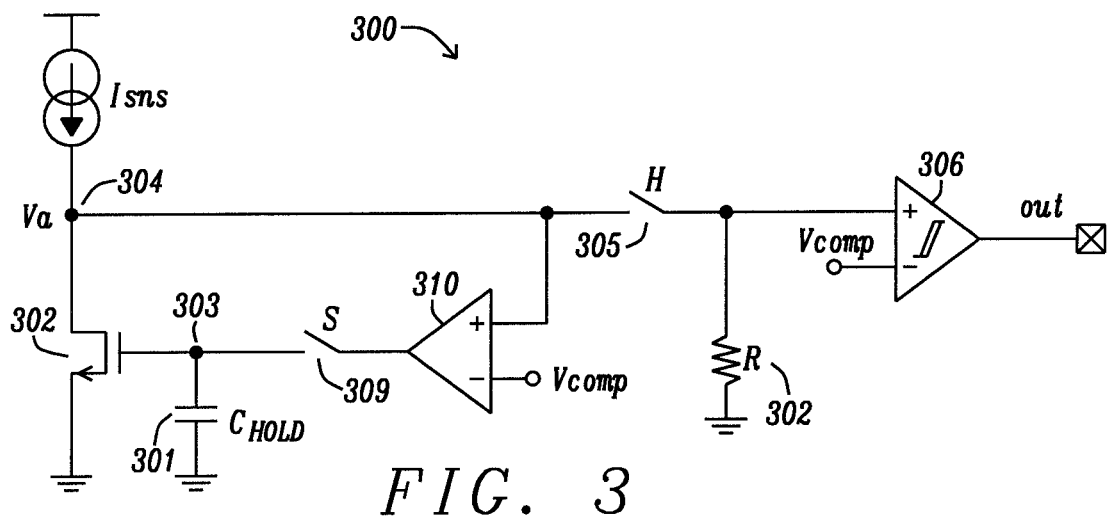
FIG. 3 shows an exemplary peak current detector.

FIG. 3 shows an exemplary peak current detector 300 according to the teachings of the present document. The example circuit in FIG. 3 receives the indicator current $I_{sns}$ at an input node 304, and determines a pedestal component of the indicator current in a first time interval during which the high side switching element 11 is open, and generates a calibrated indicator current by subtracting the pedestal component from the indicator current $I_{sns}$. The peak current detector 300 comprises a capacitor 301 for storing a pedestal voltage indicative of said pedestal component of the indicator current during said first time interval. The peak current detector 300 further comprises a transistor 302 whose gate is coupled to a terminal 303 of the capacitor 301 such that the pedestal component of the indicator current flowing through said transistor 302 during said first time interval causes said capacitor 301 to be charged to said pedestal voltage.

The peak current detector 300 further comprises a comparator 306 and a first switch 305 configured to connect, during a second time interval during which the high side switching element 11 is closed, the input node 304 of the peak current detector 304 with an input of the comparator 306 such that the calibrated indicator current is branched off from the indicator current. In the depicted example, the peak current detector 300 comprises a resistor 307 coupled between the input of said comparator 306 and ground. The peak current detector 300 may optionally comprises an error amplifier 310 for comparing a voltage at the input node 304 with a reference voltage, and a second switch 309 for connecting, during the first time interval, an output of the error amplifier with the terminal 303 of the capacitor 301.

Figure 4:
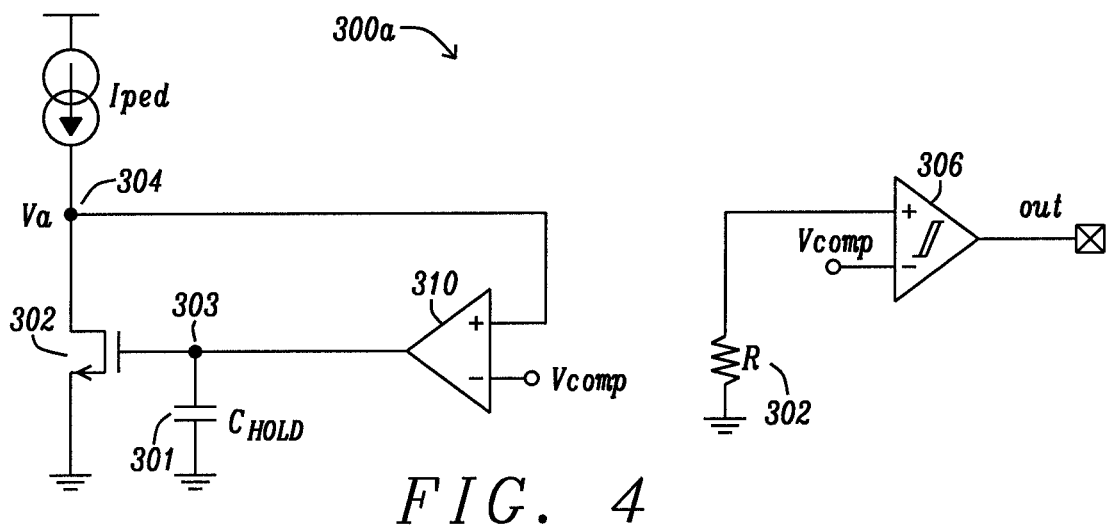
FIG. 4 shows selected components of the exemplary peak current detector depicted in FIG. 3 during a sample phase.

FIG. 4 shows selected components 300a of the exemplary peak current detector 300 depicted in FIG. 3 during the first time interval i.e. during a sample phase. During the sample phase, the first switch 305 is open and the second switch 309 is closed. As a result, the indicator current $I_{sns}$, which in this case equals the pedestal component of the indicator current, flows through the transistor 302 generating a gate-source voltage $V_{gs}$ that will be sampled as a corresponding pedestal voltage on the capacitor 301. The current for the saturated transistor 302 behaves according to the following formulae:

$$I_{DS}=k(V_{GS}-V_{th})^2(1+\lambda V_{DS})$$

wherein $V_{DS}=V_a$, and $V_a$ denotes the voltage at input node 304 of the peak current detector 300.

Figure 5:
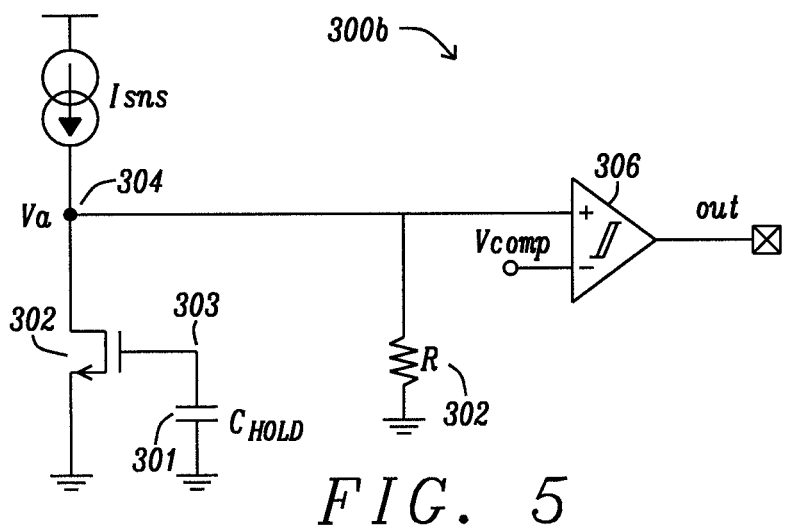
FIG. 5 shows selected components of the exemplary peak current detector depicted in FIG. 3 during a hold phase.

FIG. 5 shows selected components 300b of the exemplary peak current detector 300 depicted in FIG. 3 during the second time interval i.e. a hold phase. In the hold phase, transistor 302 and capacitor 301 replicate the pedestal component of the indicator current and the rest of the indicator current $I_{sns}$ (also denoted as calibrated indicator current) will flow to resistor 307. More specifically, the current created by transistor 302 may be equal to the pedestal component of the indicator current when the circuit reaches the peak current threshold (taking also into account the effect of the drain-source voltage $V_{DS}$ of transistor 302). In FIG. 5, the voltage $V_a$ at input node 304 of the peak current detector 300 needs to reach the reference voltage $V_{comp}$ of the comparator 306 in order to trigger the comparator 306.

Figure 6:
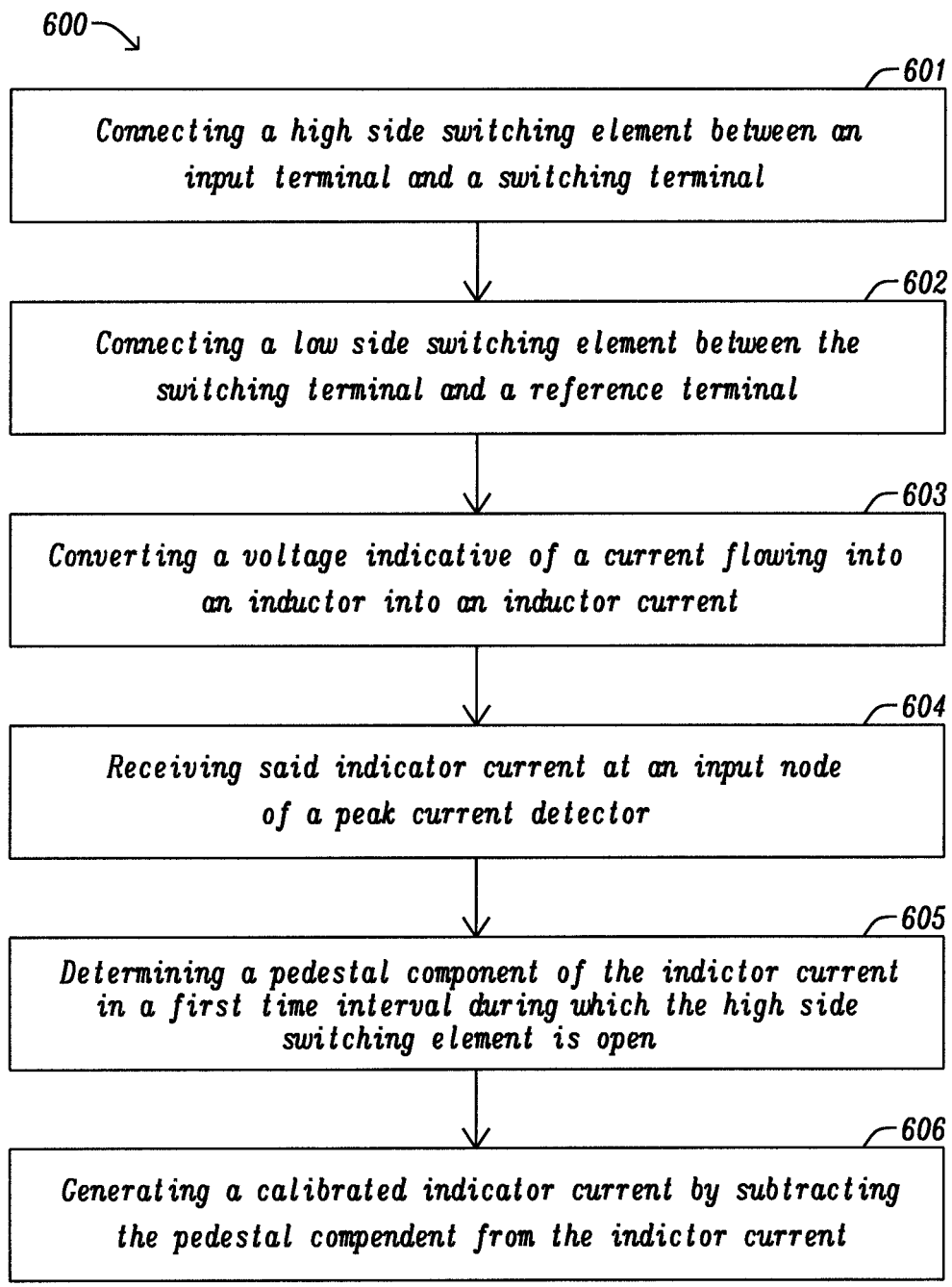
FIG. 6 shows a flow diagram of a method for converting electrical power.

FIG. 6 shows a flow diagram of a method 600 for converting electrical power. The method describes conversion of electrical power at an input voltage at an input terminal of a power converter into electrical power at an output voltage at an output terminal of the power converter. In step 601, within a power stage of the power converter, a high side switching element is connected between the input terminal and a switching terminal. In step 602, a low side switching element is connected between the switching terminal and a reference terminal. The method further comprises the step 603 of converting, using a voltage-to-current converter coupled to the power stage, a voltage indicative of a current flowing into an inductor into an indicator current. In step 604, said indicator current is received at an input node of a peak current detector. In step 605, a pedestal component of the indicator current is determined in a first time interval during which the high side switching element is open. Finally, in step 606, a calibrated indicator current is generated by subtracting the pedestal component from the indicator current.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A power converter configured to convert electrical power at an input voltage at an input terminal into electrical power at an output voltage at an output terminal, wherein the power converter comprises
    a power stage with a high side switching element connected between the input terminal and a switching terminal, and a low side switching element connected between the switching terminal and a reference terminal,
    a voltage-to-current converter coupled to the power stage and configured to convert a voltage indicative of a current flowing into an inductor into an indicator current; and
    a peak current detector configured to receive said indicator current at an input node, to determine a pedestal component of the indicator current in a first time interval during which the high side switching element is open, and to generate a calibrated indicator current by subtracting the pedestal component from the indicator current; wherein the peak current detector is configured to compare said calibrated indicator current with a threshold current value for detecting a peak of the current flowing into the inductor;
    wherein the peak current detector further comprises a transistor and a capacitor, wherein a gate of the transistor is coupled to a terminal of the capacitor such that the pedestal component of the indicator current flowing from the input node through said transistor during said first time interval causes said capacitor to be charged to a pedestal voltage indicative of said pedestal component of the indicator current, and wherein the peak current detector further comprises a comparator and a first switch configured to connect, during a second time interval during which the high side switching element is closed, the input node of the peak current detector with an input of the comparator such that the calibrated indicator current is branched off from the indicator current.

2. The power converter according to claim 1, wherein the peak current detector is configured to generate the calibrated indicator current by subtracting the pedestal component from the indicator current in a second time interval during which the high side switching element is closed.

3. The power converter according to claim 1, wherein the peak current detector further comprises a resistor coupled between the input of said comparator and the reference terminal.

4. The power converter according to claim 1, wherein the power stage further comprises a replica transistor coupled to the switching terminal, wherein a gate of the replica transistor is coupled to a gate of the high side switching element, and wherein the voltage indicative of the current flowing into the inductor is provided at a terminal of the replica transistor.

5. The power converter according to claim 1, wherein the voltage-to-current converter comprises at least one current mirror.

6. The power converter according to claim 1, wherein the voltage-to-current converter comprises at least two current sources.

7. The power converter according to claim 2, wherein the peak current detector further comprises an error amplifier configured to compare a voltage at the input node with a reference voltage, and a second switch configured to connect, during the first time interval, an output of the error amplifier with a terminal of the capacitor.

8. A method of converting electrical power at an input voltage at an input terminal of a power converter into electrical power at an output voltage at an output terminal of the power converter, wherein the method comprises:
   connecting, within a power stage of the power converter, a high side switching element between the input terminal and a switching terminal, and a low side switching element between the switching terminal and a reference terminal,
   converting, using a voltage-to-current converter coupled to the power stage, a voltage indicative of a current flowing into an inductor into an indicator current,
   receiving said indicator current at an input node of a peak current detector,
   determining a pedestal component of the indicator current in a first time interval during which the high side switching element is open,
   generating a calibrated indicator current by subtracting the pedestal component from the indicator current, and
   comparing, by the peak current detector, said calibrated indicator current with a threshold current value for detecting a peak of the current flowing into the inductor;

wherein the peak current detector further comprises a transistor and a capacitor, wherein the method comprises:
   coupling a gate of the transistor to a terminal of the capacitor such that the pedestal component of the indicator current flowing from the input node through said transistor during said first time interval causes said capacitor to be charged to a pedestal voltage indicative of said pedestal component of the indicator current;
   and wherein the peak current detector further comprises a comparator and a first switch, wherein the method comprises:
   connecting, by the first switch, during a second time interval during which the high side switching element is closed, the input node of the peak current detector with an input of the comparator such that the calibrated indicator current is branched off from the indicator current.

9. The method of claim 8, further comprising generating, by the peak current detector, the calibrated indicator current by subtracting the pedestal component from the indicator current in a second time interval during which the high side switching element is closed.

10. The method of claim 8, further comprising providing a resistor between the input of said comparator and the reference terminal.

11. The method of claim 8, further comprising arranging an error amplifier and a second switch within the peak current detector, comparing, using the error amplifier, a voltage at the input node with a reference voltage, and connecting, using the second switch, during the first time interval, an output of the error amplifier with a terminal of the capacitor.

12. The method of claim 8, further comprising coupling a replica transistor to the switching terminal of the power stage and coupling a gate of the replica transistor to a gate of the high side switching element such that the voltage indicative of the current flowing into the inductor is provided at a terminal of the replica transistor.

13. The method of claim 8, further comprising providing at least one current mirror within the voltage-to-current converter.

14. The method of claim 8, further comprising providing at least two current sources within the voltage-to-current converter.

* * * * *